United States Patent
Kash et al.

[11] Patent Number: 5,940,545
[45] Date of Patent: Aug. 17, 1999

[54] NONINVASIVE OPTICAL METHOD FOR MEASURING INTERNAL SWITCHING AND OTHER DYNAMIC PARAMETERS OF CMOS CIRCUITS

[75] Inventors: Jeffrey Alan Kash, Pleasantville; James Chen-Hsiang Tsang, White Plains, both of N.Y.

[73] Assignee: International Business Machines Corporation, Armonk, N.Y.

[21] Appl. No.: 08/683,837

[22] Filed: Jul. 18, 1996

[51] Int. Cl.⁶ .................................................. G06K 9/20
[52] U.S. Cl. ............................................................ 382/312
[58] Field of Search .................................... 324/501, 522, 324/719, 724, 158 R, 751; 382/141, 149, 312; 250/311, 307, 214 VT, 363 S, 461.1; 356/311, 237, 338; 348/92, 79, 87, 126, 216, 217, 241, 297

[56] References Cited

U.S. PATENT DOCUMENTS

| | | | |
|---|---|---|---|
| 4,415,807 | 11/1983 | Friauf et al. | 250/363.5 |
| 4,680,635 | 7/1987 | Khurana | 358/211 |
| 4,686,371 | 8/1987 | Birch et al. | 250/461.1 |
| 4,755,874 | 7/1988 | Esrig et al. | 358/106 |
| 4,766,372 | 8/1988 | Rao | 324/158 R |
| 4,811,090 | 3/1989 | Khurana | 358/93 |
| 5,006,717 | 4/1991 | Tsutsu et al. | 250/484.1 |
| 5,175,495 | 12/1992 | Brahme et al. | 250/311 |
| 5,301,006 | 4/1994 | Bruce | 356/311 |
| 5,391,885 | 2/1995 | Imatake et al. | 356/237 |
| 5,504,431 | 4/1996 | Maeda et al. | 324/501 |
| 5,523,694 | 6/1996 | Cole, Jr. | 324/751 |
| 5,541,547 | 7/1996 | Lam | 382/149 |
| 5,561,293 | 10/1996 | Peng et al. | 250/307 |
| 5,598,100 | 1/1997 | Maeda et al. | 324/521 |
| 5,656,807 | 8/1997 | Packard | 250/214 VT |
| 5,661,520 | 8/1997 | Bruce | 348/92 |
| 5,724,131 | 3/1998 | Chim et al. | 356/237 |
| 5,754,291 | 5/1998 | Kain | 356/338 |
| 5,760,892 | 6/1998 | Koyama | 356/237 |

OTHER PUBLICATIONS

Weste, N. et al. (1993), "Principles of CMOS VLSI Design: A Systems Perspective", Second Edition.

McMullan, W.G. et al. (1987), "Simultaneous Subnanosecond Timing Information and 2D Spatial Information From Imaging Photomultiplier Tubes", *Rev. Sci. Instrum.* 58(9):1626–1628.

(List continued on next page.)

*Primary Examiner*—Jose L. Couso
*Attorney, Agent, or Firm*—Skully, Scott, Murphy & Presser; Kevin M. Jordan, Esq.

[57] ABSTRACT

Intrinsic, transient optical emission from a CMOS integrated circuit is used to determine the internal switching of such a circuit including the temporal evolution of its logic states. By joining an appropriate optical microscope to a suitable, photon counting, multichannel optical detector which is capable of time resolution better than 100 psec, and a spatial resolution of better than 60 microns, full temporal information, including the relative phases of switching events, can be obtained from many devices in a circuit simultaneously. The time and spatial resolution are suitable for analyzing timing problems in present and future sub-micron-scale CMOS integrated circuits with switching speeds up to at least 10 GHz. The invention comprises a combination of an optical microscope and a detector capable of providing optical waveforms and/or spatial images of the light emitted during electrical switching by the individual devices which comprise an integrated circuit. The microscope and detector are combined such that an image of all or a portion of an integrated circuit under test is provided by the microscope to the detector. The spatial and temporal information from the detector is used to determine switching times and other dynamic information about the devices in the circuit.

31 Claims, 6 Drawing Sheets

OTHER PUBLICATIONS

Hawkins, C. et al. (1990), "The Use of Light Emission in Failure Analysis of CMOS ICs", *ISTFA*: pp. 55–67.

Hungerford, G. et al. (1996), "Single–Photon Timing Detectors for Fluorescence Lifetime Spectroscopy", *Meas. Sci. Technol.* 7:121–135.

Firmani, C. et al. (1982), "High–Resolution Imaging With A Two–Dimensional Resistive Anode Photon Counter", *Rev. Sci. Instrum.* 53(5):570–574.

Cova, S. et al. (1993), "Constant–Fraction Circuits for Picosecond Photon Timing with Microchannel Plate Photomultipliers", *Rev. Sci. Instrum.* 64(1):118–124.

NONINVASIVE OPTICAL METHOD FOR MEASURING INTERNAL SWITCHING AND OTHER DYNAMIC PARAMETERS OF CMOS CIRCUITS

BACKGROUND OF THE INVENTION

As part of the design and fabrication of a complex high-speed integrated circuit, it is often essential to observe the logic state switching of the individual devices comprising the circuit. Information on circuit timing is useful to diagnose problems relating to high frequency operation, propagation delays, and critical timing paths. A number of techniques have been developed to make dynamic circuit measurements, such as electron beam testing, electro-optic sampling, photoconductive sampling, and photoemissive sampling. Common to all these techniques is the requirement for providing an external probe (electron beam or laser) to perform the test. This requirement leads to the inability to determine timing at more than one device at a time. For a variety of practical reasons, only electron beam testing has achieved widespread use in commercial chip development. Chief among these reasons is that the other techniques require special structures or materials on the chip which are incompatible with conventional silicon processing. Electron beam testing is limited by the need to access the relevant metal interconnect at the front surface by the electron beam. As logic circuits become more complex, with additional layers of metal interconnects and "flip-chip" bonding, the use of electron beam testing will become problematic.

A summary of the characteristics useful in a diagnostic tool includes the ability to measure many devices on the chip simultaneously, no special conditions for chip preparation or design, a technique which is non-destructive of the device, the ability to measure from the front side or the back side of the wafer, and the ability to measure internal switching speeds exceeding 10 GHz. Such a tool would provide information that would lead to both enhanced device performance and more rapid chip development, prototyping and debugging. For example, if specific devices or subcircuits of a chip can be identified as limiting the overall speed of the complete circuit, redesign of, or process modifications for, this portion of the chip can increase the yield of chips that operate at high clock speeds, increasing the performance and the economic value of the chips which are produced.

It has been known for several years that electronic devices, even majority carrier devices such as field effect transistors, including those fabricated from indirect bandgap materials such as silicon, can emit light when current is continuously passing through the device. There are a number of inventions relating to the use of these emissions to probe for failures or long-term degradation in individual devices:

U.S. Pat. No. 4,680,635 addresses the detection of light which is emitted continuously by a defective device on an integrated circuit as a means of failure analysis. This light is emitted as a result of avalanche breakdown, latch-up, current conduction through a damaged dielectric, or electrostatic discharge. Although this patent addresses enabling an image intensifier "for fixed periods of time to provide time resolution" of the images, the purpose of the time resolution is to help identify hot electron-induced long term degradation. In this patent and in the prior art, the term "time varying" refers to the decay or build-up of emissions due to the failure or degradation of a device, and not to the dynamic emissions from a normally-operating circuit which are synchronized with the logic switching of the circuit. The limited scope of this patent can be seen in the specific means chosen to obtain time resolution, that of electronically gating an intensifier. The time resolution obtainable by gating an intensifier is many orders of magnitude too slow for measuring the high speed (>1 GHz) switching of modern operating devices. Such a gating technique also makes such inefficient use of the available photons as to be very difficult to implement.

U.S. Pat. Nos. 4,755,874 and 4,811,090 provide improved means of image processing to aid in detecting the continuous faint emission discussed in U.S. Pat. No. 4,680,635. U.S. Pat. No. 5,006,717 describes a method to estimate the operating lifetime of an integrated circuit by measuring the spectral characteristics and supply voltage dependence of the optical emission associated with hot carriers.

Although each of the above patents considers using the optical emissions from silicon integrated circuits as a diagnostic for circuits, none of them address circuit timing analysis on a circuit with fully functional devices. Instead, these patents disclose the use of continuous or quasi-continuous optical emissions to evaluate circuits which are degrading due to hot carrier effects or which have already failed.

As disclosed herein, we have discovered that normally-operating (i.e., fully functional) CMOS devices emit transient pulses of light coincident with logic state switching. Further, as disclosed herein, these transient pulses of light from normally functioning devices can be used to produce useable information about the timing of such devices.

SUMMARY OF THE INVENTION

Optical emission generated by the normal electrical switching of gates in a functioning integrated circuit is used to determine dynamic information about the internal time response of the circuit. By use of a suitable multichannel optical detector which is capable of time resolution of better than 100 psec, temporal information can be obtained from many devices on a chip simultaneously. This temporal information can include, for example, the sequential evolution of the logic state of each device on the circuit. The time resolution is suitable for determining possible timing problems in present and future integrated circuits with switching speeds up to at least 10 GHz.

The optical waveform of the emitted light is used to determine the temporal variation of the electrical voltages in the devices and circuits. Here, the term optical waveform refers to the time dependence of the optical emission from an individual device which is undergoing periodic variation in its electrical waveform, such as logic state switching. In the common case of MOS circuits, light is emitted mainly when an individual device is in saturation. Light emission from a non-time-varying yet normally operating CMOS logic circuit, which draw very little average current, is essentially undetectable with present detectors. However, individual devices draw significant current and may very briefly be in saturation when the CMOS gate switches logic states. We have discovered that optical emission from a normally operating CMOS circuit when undergoing switching is detectable by photon counting. Consistent with the above discussion, the emission is found to be a subnanosecond pulse coincident with switching. This pulsed emission can be a useful contactless probe of circuit timing for switching speeds up to and exceeding 10 GHz. In addition, the emitted photon energy can be either above or below the energy gap of the semiconductor. Thus, the measurement may be performed from either the front side or the back side of the wafer. For detection from the front side of the wafer, any photons emitted by the elements of the integrated circuit can be detected. For detection from the back side of the wafer, only photons which are at a wavelength transparent to the substrate can be detected. Ideally, for backside detection, as presently realized, the backside of the wafer should be optically polished and the wafer should be as thin as practical while not altering the electrical characteristics of the circuit.

Two embodiments of the invention are described. The first is an embodiment where the optical waveform from only a single device of the integrated circuit is obtained at a time. The second embodiment is a multichannel means of detecting this emission with time resolution at each pixel, allowing the timing of many devices on the circuit simultaneously.

The present invention enables measurements from fully-functional integrated circuits. Specifically, this invention obtains dynamic information (e.g., logic transitions, logic timing fails, and high frequency failures) on a fully-functional normal integrated circuit; obtains information on individual device parameters on a fully-functional normal integrated circuit; requires no special devices or structures to be manufactured on the integrated circuit solely for the purpose of the testing; is capable of testing from either the front side or the back side of the integrated circuit; requires no external probe such as a laser or an electron beam; and can be implemented either in a single channel version or in a multichannel version capable of monitoring numerous devices on the same chip simultaneously.

Further, this invention utilizes the same clock as the usual chip clock, with no constraints on clock frequency; is capable of measuring switching speeds in excess of 10 GHz; is non-destructive of the circuit under test; and can perform tests in air and does not require vacuum or unique environment.

The invention comprises a combination of an optical microscope and a detector, where the detector is capable of providing optical waveforms and/or a spatial image of the light emitted by the individual devices which comprise an integrated circuit. The microscope and detector are combined such that an image of all or a portion of an individual device or an integrated circuit under test is provided by the microscope to the detector. The spatial and temporal information from the optical detector is used to determine switching times and other dynamic information about the devices.

BRIEF DESCRIPTION OF THE DRAWINGS

The invention will be more fully understood and further advantages will become apparent when reference is made to the following detailed description of the preferred embodiments of the invention and the accompanying drawings in which.

DETAILED DESCRIPTION OF THE INVENTION

Figure 1:
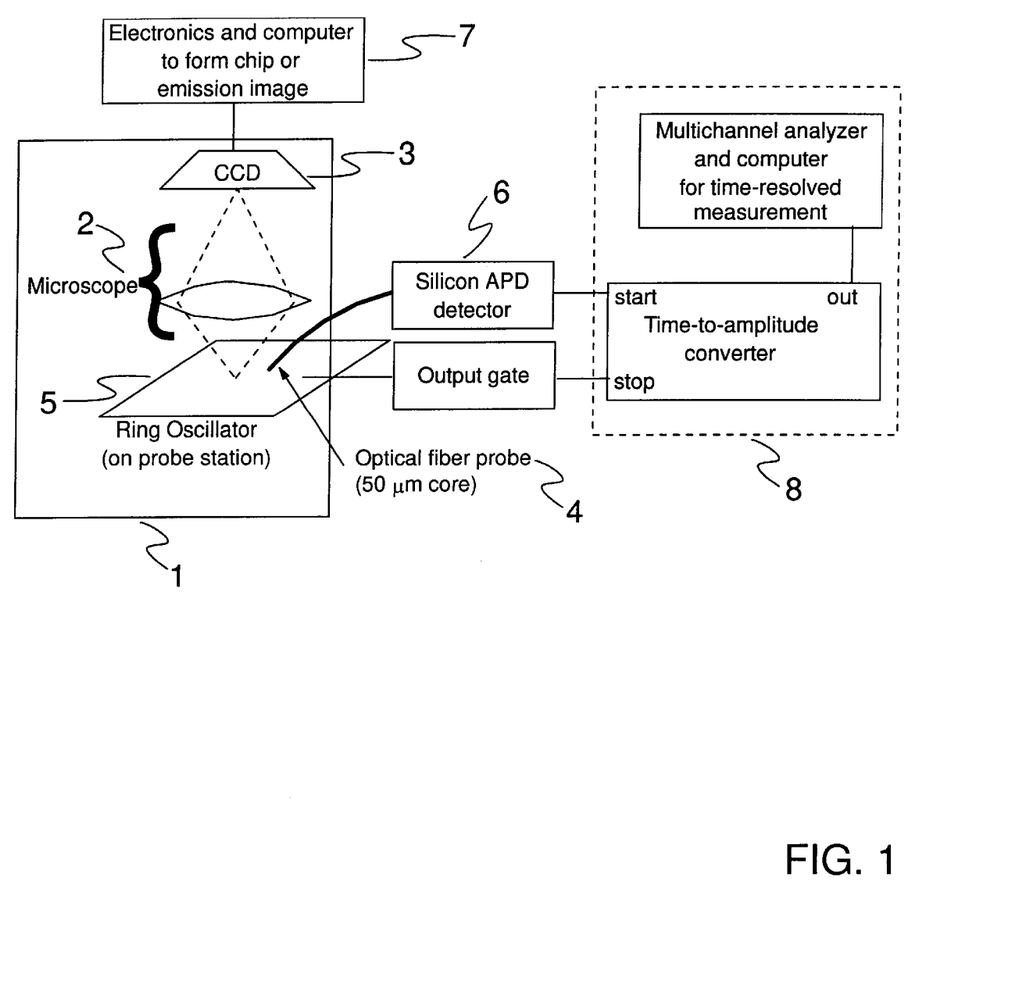
FIG. 1 shows schematically an apparatus for obtaining an optical image and one optical waveform according to the invention.

FIG. 1 shows schematically an apparatus for obtaining an optical image and one optical waveform according to the invention. The apparatus of FIG. 1 comprises a dark space 1, a microscope 2 disposed in the dark space 1, an imaging optical detector such as a charge-coupled-device (CCD) 3 placed at the image plane of microscope 2, an optical sampling probe 4 placed in proximity to the device under test 5, an optical detector 6 which receives the optical emission from the probe 4, a readout 7 for imaging detector 3 capable of providing an optical image of the emission, and a readout 8 for optical detector 6 capable of providing the optical waveform detected by detector 6. Optical probe 4 may alternately be placed in any image plane of microscope 2 so as to receive light from a single portion of the circuit. Multiple optical probes may also be used. The semiconductor integrated circuit to be evaluated 5 is mounted in the microscope and powered by a suitable power source. Optical detector 6 ideally is sensitive to single photons. Examples are photon-counting photomultipliers or photon counting avalanche photodiodes (APDs). For a photon-counting detector, readout 7 can be of the type described in the literature as photon timing as described by Charbonneau et al., Res. Sci. Instrum. 63, 5315 (1992) which is incorporated here by reference. Although other types of readouts may be used, the photon timing readout preserves single photon sensitivity and is capable of determining the optical waveform with a demonstrated resolution of 20 psec. Other optical sampling techniques such as up-conversion as described by Shah et al., Appl. Phys. Lett. 50, 1307 (1987), which is incorporated herein by reference, or a streak camera, such as model C1587, manufactured by Hamamatsu Photonics K.K., Japan may also be used.

Figure 2:
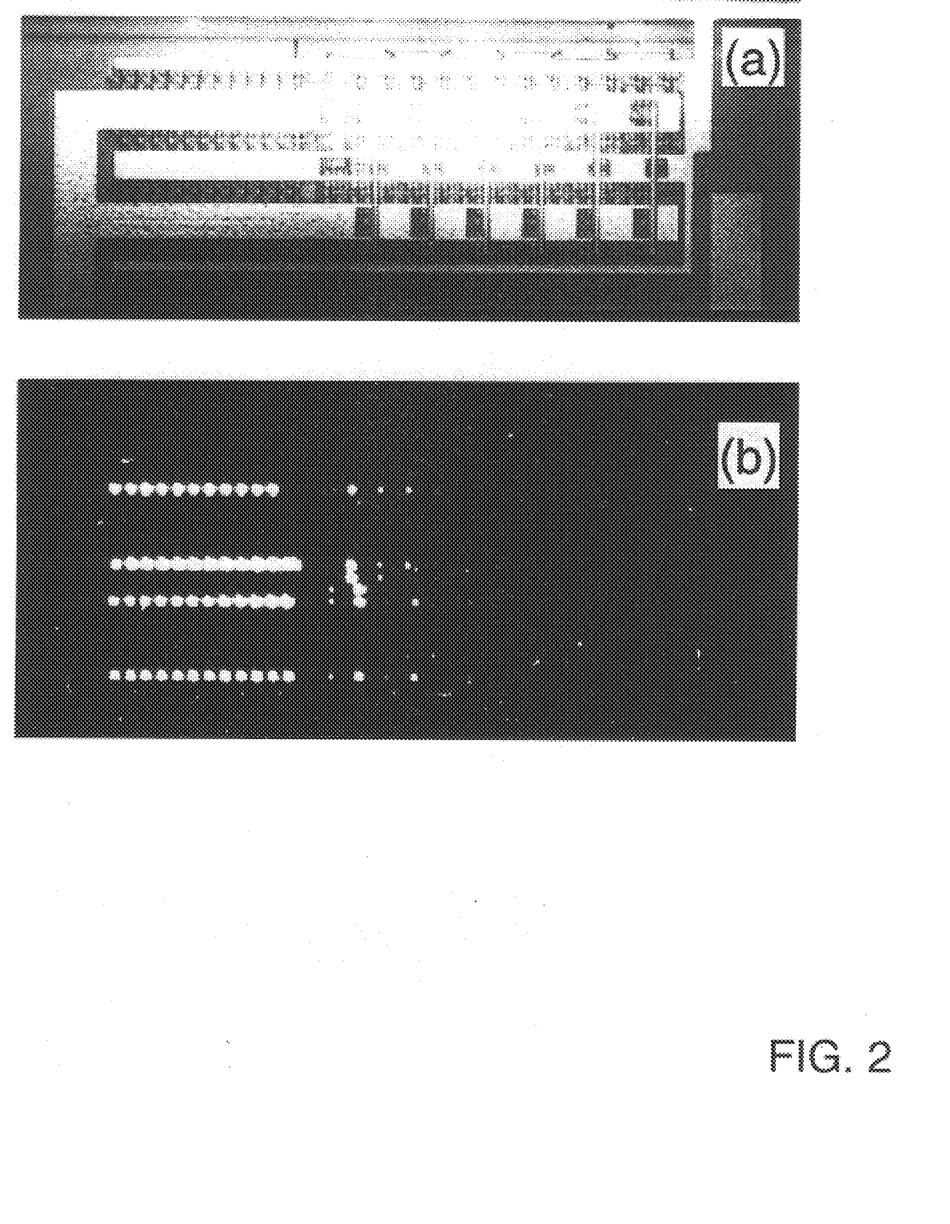
FIG. 2 shows images obtained from the apparatus of FIG. 1.
Figure 3:
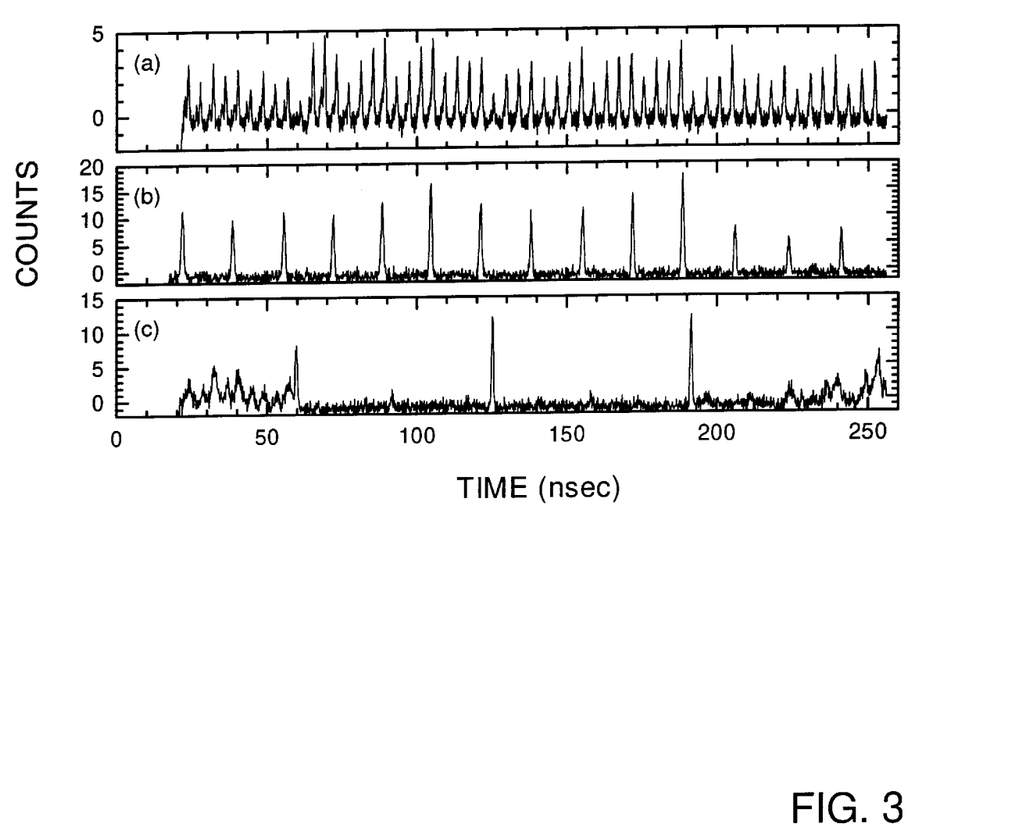
FIG. 3 shows optical waveforms obtained from the apparatus of FIG. 1.

In a specific implementation of the apparatus of FIG. 1, the semiconductor integrated circuit was a free-running ring oscillator consisting of 47 inverter gates in series, with a countdown circuit dividing the ring frequency by 32 at the output gate, and was fabricated using conventional CMOS technology. Imaging detector 3 was a CCD (EEV 15-11, cooled to −90° C.). Readout 7 for the CCD was the Photometrics AT-200 Camera System. The optical probe was a cleaved multimode fiber held a few microns above the circuit, while optical detector 6 was a photon counting APD (EG&G SPCM-AQ). The photon counting pulse output of the APD was used to start a time-to-amplitude converter (TAC), also sometimes referred to as a time-to-pulse-height converter (TPHC). The TAC was stopped by a pulse derived from the output of the countdown circuit. The pulse height output of the TAC thus produced a histogram on a multichannel analyzer that represented the time response of the photons detected by the APD. As is usually the case for such a photon timing system, fewer than 1 photon per cycle of the countdown circuit was detected so that the histogram is equivalent to a repetitively sampled waveform. The temporal response of the system was measured with a picosecond laser to be about 300 psec. FIG. 2 shows the type of information which may be obtained from the CCD, where an image of the ring oscillator under external illumination is shown in FIG. 2(a) and the periodic emission from the normally-operating ring oscillator is shown in FIG. 2(b). Although the emission shown in the image of FIG. 2(b) actually consists of a series of subnanosecond pulses, it is not possible to read out a CCD or gate an intensified CCD rapidly enough to observe the pulsed nature of the emission. FIG. 3 shows the emission detected by the APD and analyzed by the photon timing system. Emissions from three different portions of the circuit are shown, corresponding to moving the probe over different elements of the circuit. FIG. 3 reveals the subnanosecond pulse nature of the emissions, thereby illustrating the ability of this invention to measure the internal switching of an integrated circuit.

Figure 4:
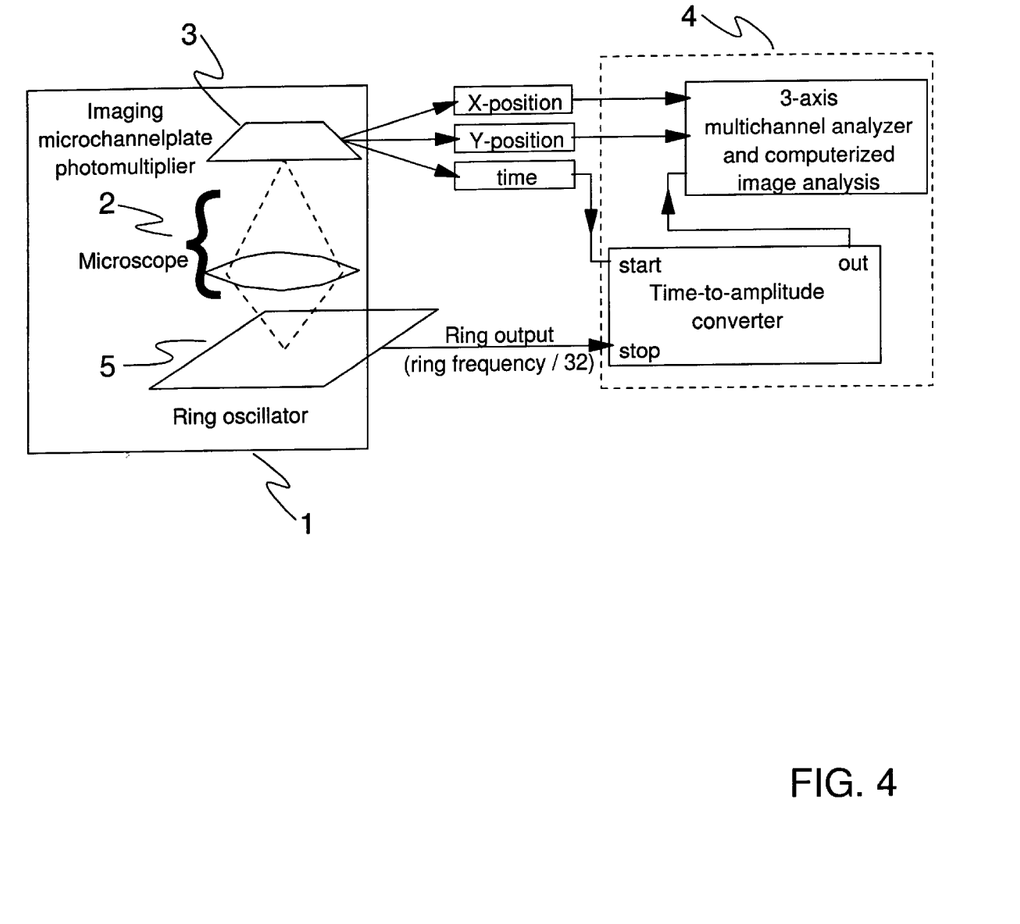
FIG. 4 shows schematically an apparatus for obtaining a series of optical images, each corresponding to a separate time interval and multiple optical waveforms according to the invention.

FIG. 4 shows schematically an apparatus for obtaining time resolved optical images and optical waveforms according to the invention. The apparatus of FIG. 4 comprises a dark space 1, a microscope 2 disposed in the dark space 1, an imaging optical detector 3 such as a imaging microchannelplate photomultiplier tube, a readout 4 for the imaging detector 3 capable of providing a series of optical images of the emission, each comprising a separate time interval. Alternatively, readout 4 is capable of providing a series of optical waveforms detected by detector 3, where each waveform is obtained from a different portion of the image. A semiconductor integrated circuit to be evaluated 5 is mounted in the microscope and powered by a suitable power source. Ideally, detector 3 is capable of counting single photons. For a photon-counting detector, the portion of readout 7 which provides temporal information can be of the type described in the literature as photon timing. Other optical sampling techniques such as up-conversion or a streak camera may also be used.

Figure 5:
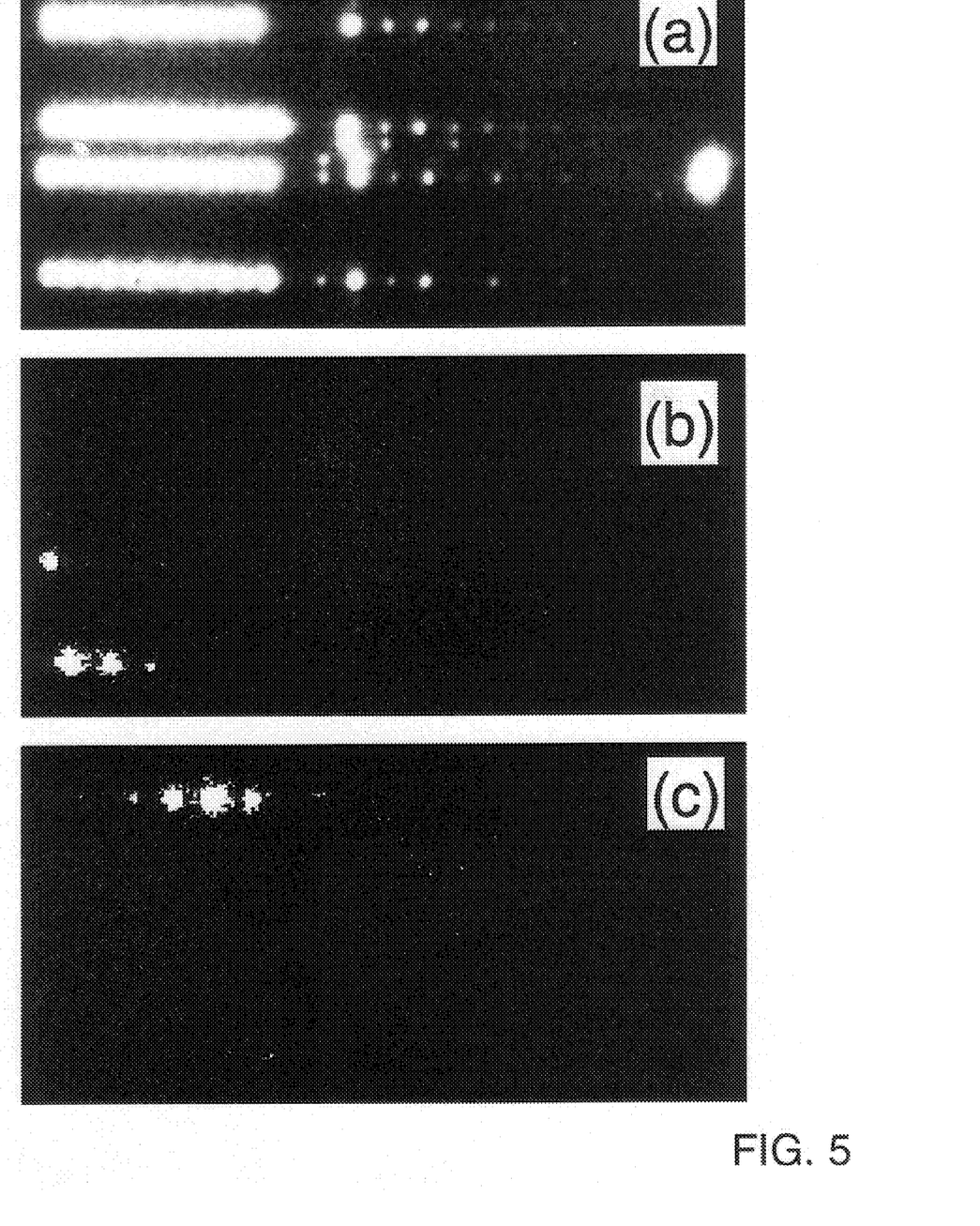
FIG. 5 shows a series of optical images, each corresponding to a separate time interval, obtained from the apparatus of FIG. 4.
Figure 6:
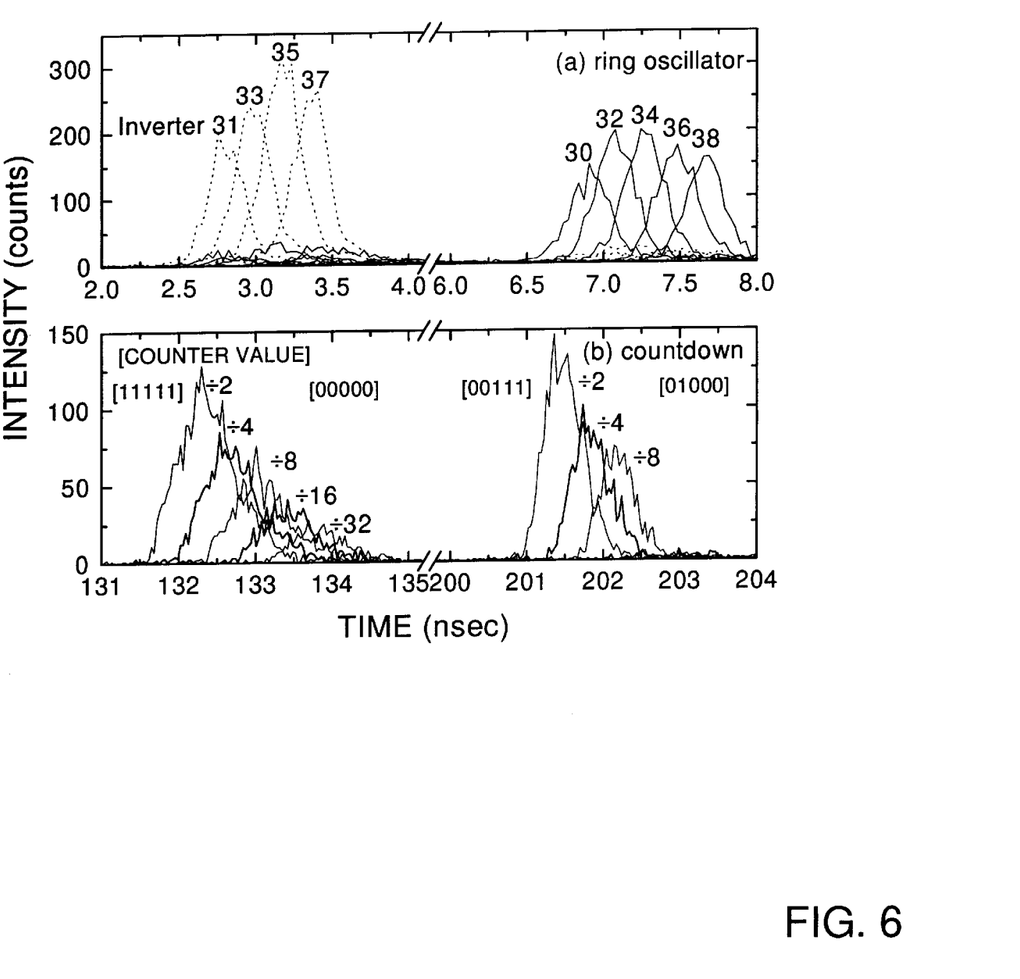
FIG. 6 shows multiple optical waveforms obtained simultaneously from the apparatus of FIG. 4.

In a specific implementation of the apparatus of FIG. 4, the same integrated circuit as was previously described and illustrated in FIG. 2 was used. Here, the imaging optical detector 3 was an imaging microchannelplate photomultiplier tube (MEPSICHRON) available from Quantar Technology Inc. of Santa Cruz, Calif. This type of photomultiplier has been shown to be capable of about 100 psec time resolution. The readout 4 was a three-dimensional multichannel analyzer, which stored information about both the position (x,y) and time (t) for each photon detected. FIG. 5 and FIG. 6 present different ways of displaying this information. FIG. 5(a) presents an image of the emissions from the circuit integrated over all times, which provides information similar to that of FIG. 2(b). FIG. 5(b) shows an image which corresponds to photons detected in a 136 psec time interval at 3.33 nsec after a trigger derived from the output of the circuit. FIG. 5(c) shows an image which corresponds to photons detected in a 136 psec time interval at 4.63 nsec after a trigger derived from the output of the circuit. Similar images may be produced corresponding to any desired time interval. Each such image shows which devices are in the process of changing logic states during that time interval. This is because changes in logic state in CMOS circuits involve changing the voltage at the output of a gate from ground to the bias voltage or from the bias voltage to ground. Although negligible currents (generating no observable light emission) flow in these circuits when the input and output voltages are held constant, measurable currents flow through the n- and p-MOSFET's of the CMOS circuits during switching, with the peak current at the time of most rapid voltage change. Because there are non-zero voltages across the n- and p-MOSFET's during this current pulse, light is emitted by the energetic electrons in the channels, which is shown in FIG. 5. At any given instant of time such as those shown in FIG. 5, only those CMOS gates that are switching states are passing current, and are emitting light. FIG. 6 shows the optical waveforms for many of the individual devices on the circuit. FIG. 6(a) provides optical waveforms from a number of the inverters of the ring oscillator portion of the circuit, while FIG. 6(b) provides optical waveforms from various portions of the countdown section of the circuit. These optical waveforms form a complete functional timing diagram of the semiconductor integrated circuit.

The successive traces in FIG. 6(a) show that the delay in the switching of the next-nearest-neighbor gates in the previously described circuit is about 0.180 nsec. The pattern of weak and strong emission lines with next-nearest-neighbor inverters showing similar emission intensities, and nearest-neighbor inverters showing very different emission intensities, demonstrates that the switching transitions between nearest-neighbor gates involve voltages changes of opposite signs, i.e., in one case from bias voltage ($V_{DD}$) to ground (time period 6.5 to 8.9 nsec with strong emission lines from inverters 30, 32, 34, 36, 38) and in the other, from ground to bias (time period 2.5 to 4.0 nsec with strong emission lines from inverters 31, 33, 35, 37), while the next-nearest-neighbor transitions involve transitions of the same sign. This is in agreement with the analysis of the time dependence of the electrical signals in the ring oscillator. The successive traces in FIG. 6(b) show the normal functioning of the 5 stage, divide by 32 countdown portion of the previously described circuit. Every increment of the counter produces at least one pulse of light. All the gates of the 5 stages are at the bias voltage (or [11111]) after 31 pulses. The 32rd pulse to the counter resets the counter to zero (or [00000]) producing a cascading series of light pulses at each stage of the counter, as the divide by 2, 4, 8, 16, and 32 stages change states. Similarly, the right hand traces show how the gates of the countdown stage behave when the 8th pulse in a series arrives. The three gates marking the previous arrival of 7 pulses (state 00111) switch in one direction while one gate switches in the other direction to create state (01000).

While the resolution into its spatial and temporal components of the transient light emission from CMOS circuits during switching transitions provides the highest contrast for the detailed characterization of the behavior of the individuals gates in the circuit, considerable information can also be obtained from static images such as shown in FIG. 1. The intensity of the time integrated emission depends exponentially on the local electric fields in the channels of the n- and p-MOSFET's and linearly on the switching frequencies. The intensities of the light emission can be used to monitor both the local fields and the switching frequencies.

While the invention has been described with respect to preferred embodiments thereof, it will be appreciated by those having skill in the art that variations may be made in the invention without departing from the spirit and scope of the invention.

Having thus described our invention, what we claim as new and desire to secure by Letters Patent is as follows:

1. A method for measuring the internal timing of integrated circuits comprising:

a. obtaining periodic optical emissions from an integrated circuit operating with time-varying internal currents, and    b. time resolving said emissions by photon timing to provide information about said integrated circuit.

2. The method of claim 1 wherein said information is in the form of a series of optical images each comprising a discrete time interval.

3. The method of claim 1 wherein said information is in the form of one or more optical waveforms.

4. The method of claim 2 wherein the optical sampling is up-conversion.

5. The method of claim 1 wherein said emissions are measured from the front side of said integrated circuit.

6. The method of claim 1 wherein said emissions are measured from the back side of said integrated circuit.

7. The method of claim 2 wherein said image is compared to an image of the same circuit taken under different external stimuli.

8. A device for measuring the internal timing of integrated circuits comprising:

a. means for obtaining periodic emissions from an integrated circuit operating with time varying internal currents, and     b. means for time resolving said emissions by photon timing to provide information about said integrated circuit.

9. The device of claim 8 wherein said means for obtaining include a photon-counting photomultiplier tube.

10. The device of claim 8 wherein said means for obtaining include an avalanche photodiode detector.

11. The device of claim 8 wherein said means for obtaining include an imaging microchannelplate photomultiplier.

12. The device of claim 8 wherein said means for analyzing include a time-to-amplitude converter and a multichannel analyzer.

13. The device of claim 8 wherein said means for analyzing include a time-to-amplitude converter and a 3-axis multichannel analyzer.

14. An optical method for determining the electrical state of an integrated circuit, and the temporal evolution of said electrical state for a circuit undergoing switching transitions, the method comprising:

a. obtaining one or more optical waveforms corresponding to optical emissions generated by time varying internal currents in the integrated circuit, and     b. analyzing said one or more optical waveforms to identify and characterize the electrical waveforms associated with said currents.

15. The method of claim 14 wherein said optical waveforms are in the form of a series of optical images each comprising a discrete time interval.

16. The method of claim 14 wherein said obtaining step further comprises the step of obtaining the optical waveform by photon timing.

17. The method of claim 14 wherein said obtaining step is performed using a streak camera.

18. The method of claim 14 wherein said emissions are measured from the front side of said integrated circuit.

19. The method of claim 14 wherein said emissions are measured from the back side of said integrated circuit.

20. A device for determining the electrical state of an integrated circuit, and the temporal evolution of said electrical state for a circuit undergoing switching transitions, the device comprising:

a. means for obtaining one or more optical waveforms corresponding to optical emissions generated by time varying internal currents in the integrated circuit, and     b. means for analyzing said one or more optical waveforms to identify and characterize the electrical waveforms associated with said currents.

21. The device of claim 20 wherein said means for obtaining include a photon-counting photomultiplier tube.

22. The device of claim 20 wherein said means for obtaining include an avalanche photodiode detector.

23. The device of claim 20 wherein said means for obtaining include an imaging microchannelplate photomultiplier.

24. The device of claim 20 wherein said means for analyzing include a time-to-amplitude converter and a multichannel analyzer.

25. The device of claim 20 wherein said means for analyzing include a time-to-amplitude converter and a 3-axis multichannel analyzer.

26. An optical method for determining the logic state of a CMOS integrated circuit, and the temporal evolution of said logic state for a circuit undergoing switching transitions during normal operation comprising,     a. obtaining optical pulses generated by switching transitions in a CMOS integrated circuit,     b. analyzing the optical pulses to identify 0-1 and 1-0 transitions,     c. assigning 1-0 and 0-1 transitions at the outputs of individual gates of the circuit.

27. A method according to claim 26, further comprising the steps of: mapping evolution of logic states in a CMOS circuit as a function of time.

28. A device for determining a logic state of a CMOS integrated circuit at an instant of time as the circuit undergoes information processing comprising:

a. a means for measuring the individual optical pulses generated by discrete switching transitions in said circuit,     b. a means for analyzing the relative intensities of the switching induced optical pulses observed from the individual gates of said circuits to determine the initial and final states of each switching transition,     c. a means for assigning the 1-0 and 0-1 transitions at the outputs of individual gates of the said circuit.

29. A device according to claim 28, further including means to map the temporal evolution of logic states in a CMOS circuit.

30. A method for measuring the number of switching events occurring in any interval of time and any area of the circuit in CMOS integrated circuits comprising:

a. obtaining optical emission pulses coincident with switching transitions from a CMOS integrated circuit and     b. analyzing said emission to obtain a spatial and temporal density of switching activity in the said integrated circuit.

31. A device for measuring the number of switching events occurring in any interval of time and any area of the circuit in CMOS integrated circuits comprising:

a. means for measuring the optical emission pulses coincident with switching transitions from a CMOS integrated circuit,     b. a means for determining a number of switching induced optical pulses per unit area and time interval, and displaying said densities.

* * * * *